United States Patent
Lee et al.

(10) Patent No.: US 9,521,756 B2
(45) Date of Patent: Dec. 13, 2016

(54) POWER MODULE PACKAGE AND METHOD OF FABRICATING THE SAME

(71) Applicant: SAMSUNG ELECTRO-MECHANICS CO., LTD., Suwon-Si (KR)

(72) Inventors: Young Ki Lee, Suwon-Si (KR); Sun Woo Yun, Suwon-Si (KR); Jun Woo Myung, Suwon-Si (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 201 days.

(21) Appl. No.: 14/339,080

(22) Filed: Jul. 23, 2014

(65) Prior Publication Data

US 2015/0195950 A1    Jul. 9, 2015

(30) Foreign Application Priority Data

Jan. 8, 2014 (KR) .................. 10-2014-0002479

(51) Int. Cl.
| | |
|---|---|
| *H05K 3/00* | (2006.01) |
| *H01L 25/07* | (2006.01) |
| *H01L 23/433* | (2006.01) |
| *H01L 23/495* | (2006.01) |
| *H05K 1/02* | (2006.01) |
| *H05K 3/28* | (2006.01) |

(52) U.S. Cl.
CPC ......... *H05K 3/0014* (2013.01); *H01L 23/4334* (2013.01); *H01L 23/49575* (2013.01); *H01L 25/07* (2013.01); *H01L 2224/48091* (2013.01); *H01L 2224/48137* (2013.01); *H01L 2224/48247* (2013.01); *H01L 2224/49109* (2013.01); *H01L 2924/181* (2013.01); *H05K 1/0209* (2013.01); *H05K 3/284* (2013.01); *H05K 2201/0154* (2013.01); *H05K 2201/066* (2013.01); *Y10T 29/41* (2015.01)

(58) Field of Classification Search
CPC ..... H05K 3/284; H05K 3/0014; H05K 1/0209
USPC ........ 361/702, 709, 711, 712; 257/678, 675, 257/666, 499, 531
See application file for complete search history.

(56) References Cited

U.S. PATENT DOCUMENTS

| | | | |
|---|---|---|---|
| 6,432,750 B2 | 8/2002 | Jeon | |
| 6,710,439 B2 * | 3/2004 | Lee | ................... H01L 23/49575 257/666 |

(Continued)

*Primary Examiner* — Anthony Haughton
(74) *Attorney, Agent, or Firm* — Ladas & Parry, LLP

(57) ABSTRACT

Disclosed herein is a power module package including a heat radiating plate including a step difference portion around an edge portion thereof, a semiconductor chip mounted on a mounting surface of the heat radiating plate, an external connection terminal disposed on an outer periphery of the heat radiating plate, electrically connected to the semiconductor chip, and protruding outwards, a wire for electrical connection between the semiconductor chip and the external connection terminal; and a molding portion for encapsulation of the semiconductor chip and a portion of the heat radiating plate, and in particular, the molding portion does not intrude over an exposed surface of the lower portion of the heat radiating plate through the step difference portion. In addition, disclosed herein is a fabricating method for preventing flush of the molding portion on the exposed surface.

7 Claims, 3 Drawing Sheets

(56) References Cited

U.S. PATENT DOCUMENTS

| | | | |
|---|---|---|---|
| 6,777,795 B2* | 8/2004 | Sasakura | H01L 23/13 257/685 |
| 7,061,080 B2* | 6/2006 | Jeun | H01L 21/565 257/666 |
| 7,405,467 B2* | 7/2008 | Liu | H01L 23/4334 257/672 |
| 7,449,774 B1* | 11/2008 | Jeun | H01L 23/4334 257/675 |
| 7,656,024 B2* | 2/2010 | Elbanhawy | H01L 25/16 257/531 |
| 7,936,054 B2* | 5/2011 | Eom | H01L 21/56 257/675 |
| 8,604,610 B1* | 12/2013 | Hughes | H01L 23/4334 257/675 |

* cited by examiner

POWER MODULE PACKAGE AND METHOD OF FABRICATING THE SAME

CROSS REFERENCE TO RELATED APPLICATION

This application claims the benefit of Korean Patent Application No. 10-2014-0002479, filed on Jan. 8, 2014, entitled "Power Module Package and Method of Fabricating the Same", which is hereby incorporated by reference in its entirety into this application.

BACKGROUND OF THE INVENTION

1. Technical Field

The present invention relates to a power module package and a method of fabricating the same.

2. Description of the Related Art

As energy consumption has increased globally, effective use of limited energy has attracted great attention. Accordingly, application of an inverter using an intelligent power module (IPM) for effective conversion of energy in existing home electronic appliance and/or industrial products has been gradually accelerated.

As such a power module has been extensively used, users' requirements for high integration/high capacity/small size have grown in strength. Accordingly, heating problems of other electronic components degrade overall performance of the module.

In general, when a large amount of heat is generated during a power conversion process and is not effectively removed, the performance of a module and an entire system may be degraded and the module and the system may be damaged. In addition, in accordance with current trends, multi-functional and miniaturized components are also required for an IPM. Accordingly, it is important not only to improve a structure for multifunction and miniaturization, but also to effective dissipate heat generated due to the structure.

Conventionally, in order to improve thermal performance of a power semiconductor module, a power device is mounted on a heat radiating plate formed of metal with a high heat transfer coefficient to prepare a structure molded by a molding material.

In this case, a molding process uses a mold in consideration of mass production and productivity and uses an epoxy molded compound (EMC) as a molding material.

In the molding process, when the mold is used, among surfaces of the heat radiating plates, an opposite surface of the heat radiating plate to a surface on which the power device is mounted is exposed to outside for subsequent adhesion with a heat sink in order to improve heat dissipation performance.

However, flush may occur on the exposed surface of the heat radiating plate after the molding process. As well known, flush may degrade an outer appearance of a product and also cause poor adhesion with external elements mounted on the exposed surface of the heat radiating plate. In addition, a conventional power module package causes inconvenience of performing chemical and/or mechanical methods for removal of flush.

In order to overcome the program, as disclosed in Patent Document 1, a mold structure is improved to prevent flush. However, even if the mold structure is optimized, flush is not completely prevented. A process for removing flush generated despite this via a laser, a water jet, or a chemical method is needed.

PRIOR ART DOCUMENT (Patent Document 1) U.S. Pat. No. 6,432,750

SUMMARY OF THE INVENTION

The present invention has been made in an effort to provide a power module package for preventing flush due to a molding material on an exposed surface of a heat radiating plate in advance.

According to an embodiment of the present invention, there is provided a power module package including a heat radiating plate forming a step difference portion around an edge portion thereof, a semiconductor chip mounted on a mounting surface of the heat radiating plate, an external connection terminal disposed on an outer periphery of the heat radiating plate, electrically connected to the semiconductor chip, and protruding outwards, a wire for electrical connection between the semiconductor chip and the external connection terminal, and a molding portion for encapsulation of the semiconductor chip and a portion of the heat radiating plate, thereby, particularly, preventing the molding portion from intruding on an exposed surface of a lower portion of the heat radiating plate.

The heat radiating plate may include the mounting surface, an exposed surface opposite to the mounting surface, and a side wall surface connecting the mounting surface and the exposed surface, and the step difference portion may include a step difference surface concaved towards a central region of the heat radiating plate from a lower portion of the side wall surface.

The step difference portion may include a step difference surface formed at a right angle with the exposed surface.

The step difference portion may include a chamfering portion formed at a boundary portion with the side wall surface.

The chamfering portion may be rounded.

The step difference portion may include a concave portion concavely formed towards the central region of the heat radiating plate around the step difference surface just below the exposed surface.

The concave portion may be formed at an acute angle with the exposed surface and is concavely formed at an edge portion of the exposed surface.

According to another embodiment of the present invention, there is provided a method of fabricating a power module package including preparing a heat radiating plate including a step difference portion around an edge portion thereof (S100), adhering an external connection terminal (S200), mounting a semiconductor chip on the external connection terminal (S300), wire bonding of electrically connecting the external connection terminal and the semiconductor chip (S400), and encapsulating the heat radiating plate and the semiconductor chip by a molding portion (S500).

The preparing (S100) may include etching of cutting an edge portion of the heat radiating plate so as to form a step difference portion on the heat radiating plate (S110), and punching of providing a predetermined curvature at a boundary portion between the step difference portion and a side wall surface of the heat radiating plate (S120).

The encapsulating (S500) may include performing encapsulating such that the molding portion does not protrude outward as compared with a level of an exposed surface of the heat radiating plate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
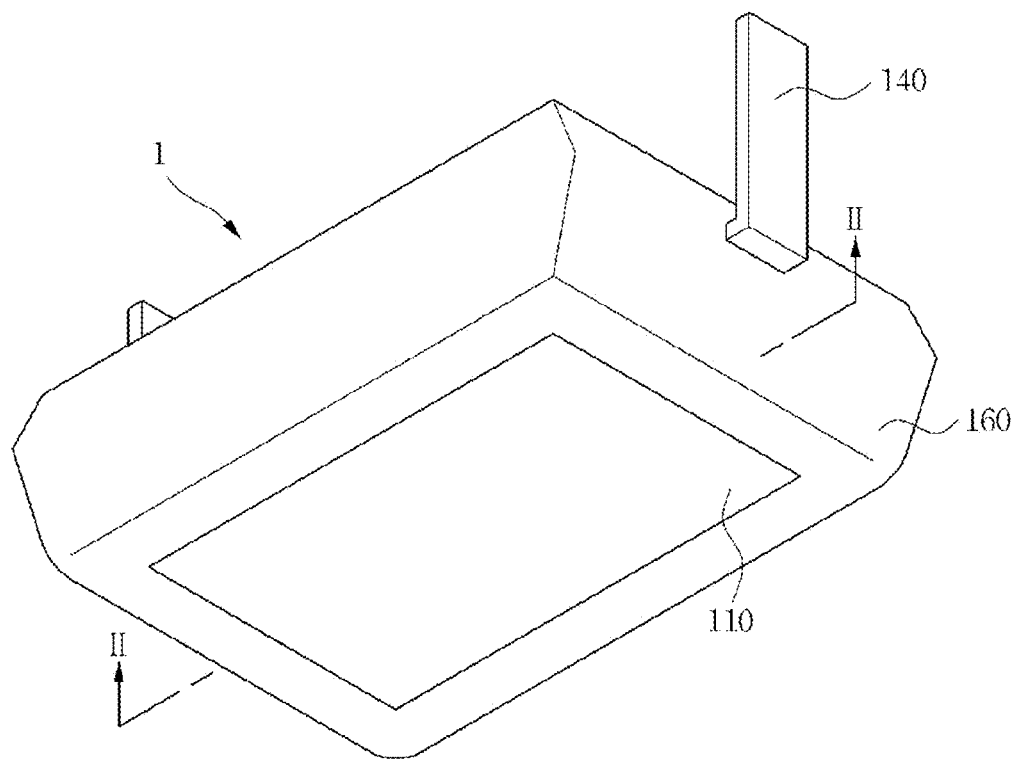
FIG. 1 is a perspective view of a power module package viewed from below according to the present invention.

Hereinafter, preferred embodiments of the present invention will be described in detail with reference to the attached drawings.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the description of the present invention, when it is determined that the detailed description of the related art would obscure the gist of the present invention, the description thereof will be omitted.

Figure 2:
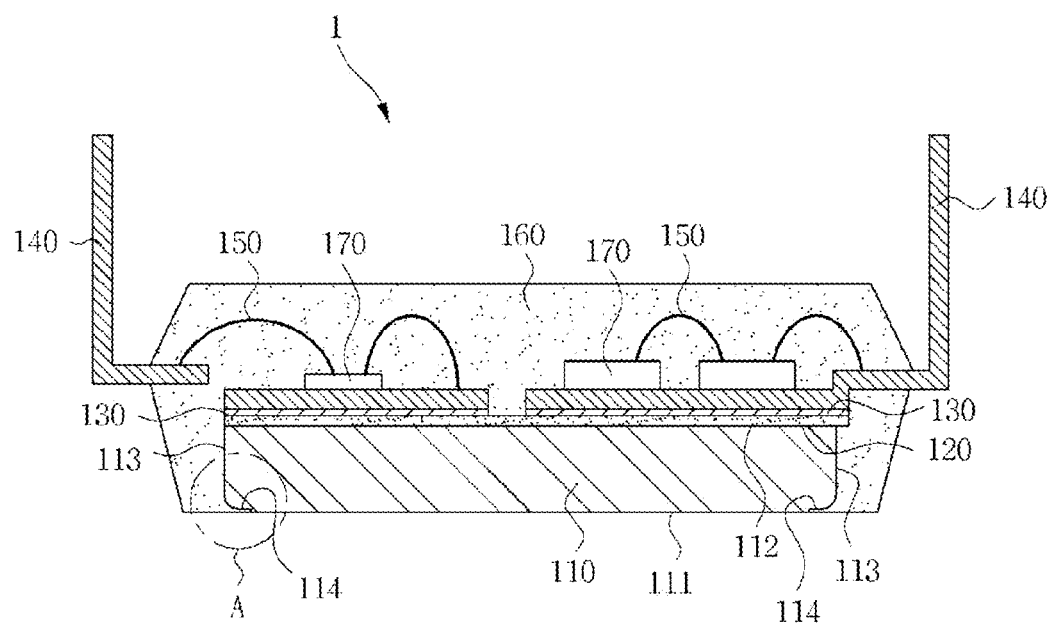
FIG. 2 is a schematic cross-sectional view of the power module package taken along a line II-II of FIG. 1.

Referring to FIGS. 1 and 2, the present invention relates to a power module package 1 for preventing flush.

The power module package 1 according to the present invention includes a heat radiating plate 110, a semiconductor chip 170 mounted on one surface of the heat radiating plate 110, that is, a mounting surface 112, an external connection terminal 140 that is disposed on an outer periphery of the heat radiating plate 110 and electrically connected to the semiconductor chip 170, conductive wires 150 for electrical connection between the semiconductor chip 170 and the external connection terminal 140, and a molding portion 160 formed to surround the heat radiating plate 110, the semiconductor chip 170, the external connection terminal 140, etc. The molding portion 160 is molded to externally expose the other surface of the heat radiating plate 110, that is, an exposed surface 111 opposite to the mounting surface 112.

As well known to those of ordinary skill in the art, the semiconductor chip 170 may be, but is not particularly limited to, a silicon controlled rectifier (SCR), a power transistor, an insulated gate bipolar transistor (IGBT), a metal oxide semiconductor (MOS) transistor, a power commutator, a power regulator, an inverter, a converter, a high power semiconductor chip or diode obtained by combining these.

In addition, the semiconductor chip 170 may include, but is not limited to, a low power semiconductor chip for control of a high power semiconductor chip, for example, a control device for control of a power device.

The heat radiating plate 110 may be a metal layer and may be formed of aluminum (Al), copper (Cu), iron (Fe), titanium (Ti), or the like with high thermal conductivity. However, the heat radiating plate 110 is not limited thereto. That is, the heat radiating plate 110 may be formed of a metallic material with high thermal conductivity to rapidly and externally dissipate heat generated during a power conversion process.

As illustrated in FIG. 2, the power module package 1 according to the present invention may be configured in such a way that an insulating layer 120 is stacked on the mounting surface 112 of the heat radiating plate 110. The insulating layer 120 may be formed of, but is not limited to, one selected from the group consisting of epoxy, polyimide (PI), liquid crystal polymer (LCP), and phenol resin, bismalemide-triazine (BT) resin.

According to the present invention, a circuit pattern 130 may be stacked on the insulating layer 120. The circuit pattern 130 may be formed by stacking a patterned metallic film or a patterned lead frame on the insulating layer 120 or may be formed via a plating process including an electroless plating process and electro plating process. However, the present invention is not limited thereto. That is, it is noted that the circuit pattern 130 may be formed on the insulating layer 120 via various methods. Here, the circuit pattern 130 may be a lead frame.

The circuit pattern 130 may be adhered to the external connection terminal 140 or may include the semiconductor chip 170 mounted thereon, and may be electrically connected to each component. On the other hand, the semiconductor chip 170 may be mounted on the external connection terminal 140. As described above, the semiconductor chip 170 may be mounted on the external connection terminal 140 via a separate adhesive member (not shown).

The power module package 1 according to the present invention may electrically connect the semiconductor chip 170 and the external connection terminal 140 in a wire bonding manner using the conductive wires 150.

As illustrated in FIGS. 1 and 2, the power module package 1 is configured in such a way that the molding portion 160 is formed of epoxy molding compound so as to surround the semiconductor chip 170, the external connection terminal 140, the conductive wires 150, and the heat radiating plate 110 and the external connection terminal 140 protrudes outside the molding portion 160.

Preferably, according to the present invention, a boundary portion between the exposed surface 111 and the molding portion 160 is formed around an edge of the exposed surface 111 so as to prevent the molding portion 160 from intruding on a central region of the exposed surface 111 of the heat radiating plate 110 by a predetermined range or more.

That is, the power module package 1 according to the present invention is configured in such a way that a step difference portion 114 is formed along the edge portion of the exposed surface 111 of the heat radiating plate 110 so as to prevent the molding portion 160 from intruding on the central region of the exposed surface 111 of the heat radiating plate 110 by a predetermined range or more. The step difference portion 114 will be described in more detail with reference to FIG. 3.

Figure 3:
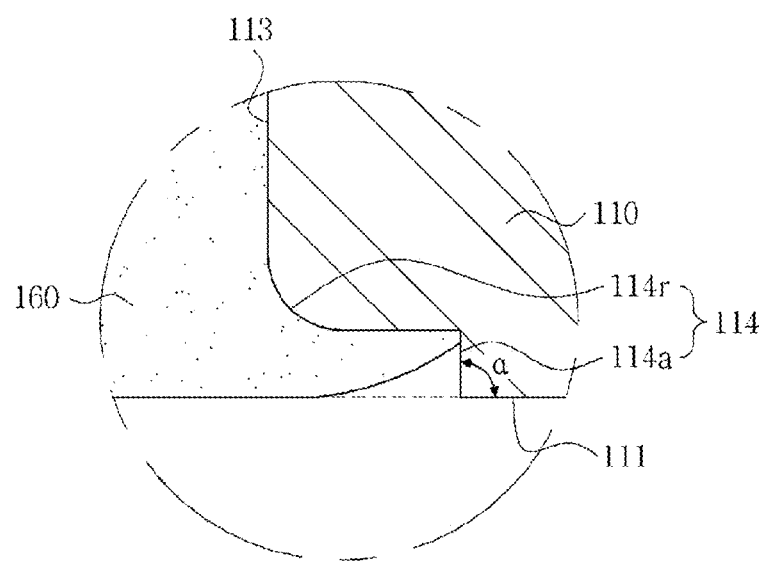
FIG. 3 is an enlarged view of a circular arc portion A of FIG. 2.

FIG. 3 is an enlarged view of a circular arc portion A of FIG. 2, which aids in understanding of the boundary portion between the molding portion 160 and the exposed surface 111 of the heat radiating plate 110.

As illustrated in FIG. 3, the step difference portion 114 is formed around the edge portion of the exposed surface 111 of the heat radiating plate 110. The step difference portion 114 has a different height from the exposed surface 111 of the heat radiating plate 110 to provide a space for capturing or escaping the molding portion 160.

That is, during a molding process, the heat radiating plate 110 may not run off over the edge portion of the exposed surface 111 of the heat radiating plate 110 using the step difference portion 114 as a medium, thereby preventing flush. The molding portion 160 may not intrude on the exposed surface 111 of the heat radiating plate 110, thereby planarizing the exposed surface 111 of the heat radiating plate 110. As a result, the planarized exposed surface 111 ensures adhesion between a power module package and other components, for example, a heat sink, etc. The heat sink may include a plurality of heat radiating pins in order to dissipate heat generated from the semiconductor chip 130 (refer to FIG. 2) to the air.

In addition, the step difference portion 114 may increase an adhesive area between the molding portion 160 and the heat radiating plate 110 to have reliable durability between a heat radiating plate and a molding portion against external shocks and/or thermal shocks.

The step difference portion 114 is concavely formed between a side wall surface 113 and the exposed surface 111 of the heat radiating plate 110, and in detail, has a step difference surface 114a concaved towards the central region of the heat radiating plate 110 from the side wall surface 113. The step difference portion 114 is formed around the edge portion of a lower surface of the heat radiating plate 110. Accordingly, a cross section of the heat radiating plate 110 may be greater than an area of the exposed surface 111. As described above in detail, the molding portion 160 is blocked by the step difference surface 114a of the step difference portion 114 so as to be molded to be lower than a level (or a height) of the exposed surface 111 of the heat radiating plate 110, and thus, the step difference portion 114 is used as an escape space for preventing the molding portion 160 from running off over the exposed surface 111.

Preferably, according to the present invention, an angle α between the step difference surface 114a and the planarized exposed surface 111 is a right angle. The step difference surface 114a of the step difference portion 114 is formed upwards with a perpendicular angle to the exposed surface 111.

In addition, the step difference portion 114 includes a chamfering portion 114r at a boundary between the step difference surface 114a and a lower portion of the side wall surface 113. The chamfering portion 114r is rounded with a predetermined curvature. As illustrated in FIG. 3, the chamfering portion 114r is inclined upwards by as much a predetermined thickness from the step difference portion 114.

Figure 4:
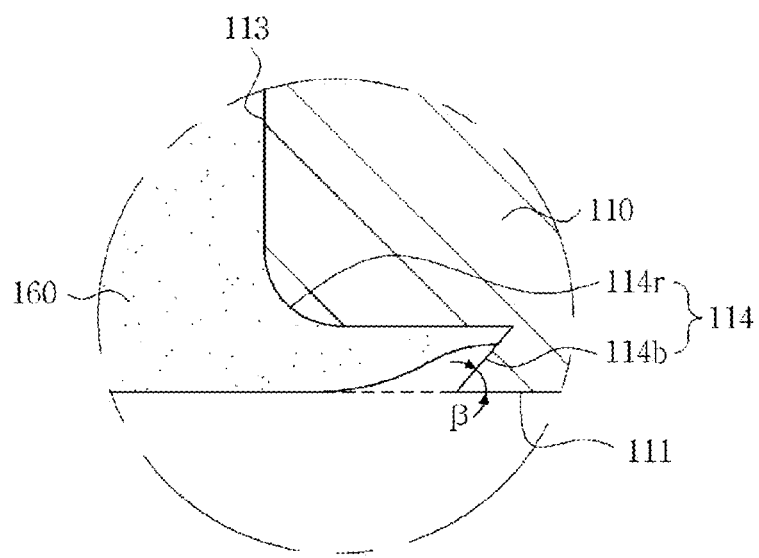
FIG. 4 is an enlarged view of a power module package having a different type of step difference portion according to the present invention.

FIG. 4 illustrates the heat radiating plate 110 having a different type of step difference portion according to the present invention. The heat radiating plate 110 illustrated in FIG. 4 is very similar to that of FIG. 3 except for the structure shape of the step difference portion 114, and thus, a detailed description of the same or similar components will be omitted to aid in clear understanding of the present invention.

The power module package according to the present invention includes the heat radiating plate 110 including the step difference portion 114 formed on the edge portion around the exposed surface 111. Alternatively, the step difference portion 114 includes a concave portion 114b that is concavely formed towards the central region of the heat radiating plate 110 around the step difference portion 114 just below the exposed surface 111. The concave portion 114b may further extend the escape space of the molding portion 160 to completely prevent the molding portion 160 from intruding.

Appropriately, according to the present invention, an angle β between the concave portion 114b and the planarized exposed surface 111 is an acute angle. As illustrated in FIG. 4, the concave portion 114b of the step difference portion 114 may be concaved towards the central region from the exposed surface 111 so as to accommodate the molding portion 160.

The step difference portion 114 may further include the chamfering portion 114r formed in the side wall surface 113. In detail, the step difference portion 114 may include the chamfering portion 114r at a boundary portion between the concave portion 114b and the lower portion of the side wall surface 113. The chamfering portion 114r is rounded so as to have a predetermined curvature. As illustrated in FIG. 4, the chamfering portion 114r is inclined upwards by as much as a predetermined thickness from the step difference portion 114.

Figure 5:
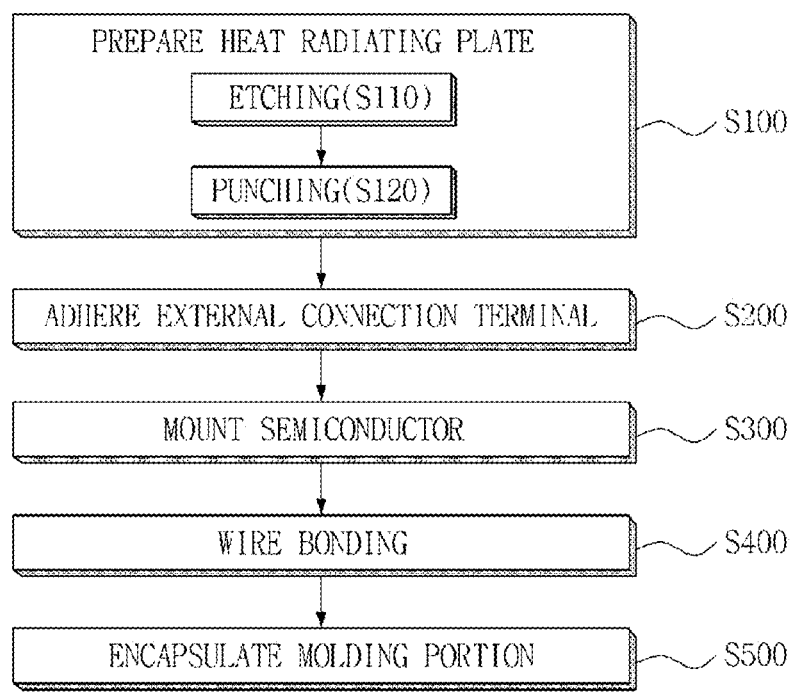
FIG. 5 is a flowchart sequentially illustrating a method of fabricating a power module package according to the present invention.

FIG. 5 is a flowchart sequentially illustrating a method of fabricating a power module package according to the present invention.

The power module package according to the present invention illustrated in FIGS. 1 to 4 may be fabricated according to the following operations, the order of which may be changed as necessary.

First, the fabricating method according to the present invention includes preparing the heat radiating plate 110 (S100).

The heat radiating plate 110 is formed of a material with high thermal conductivity, for example, a metallic layer. Preferably, the heat radiating plate 110 includes the step difference portion 114 formed around the edge portion of the other surface of the heat radiating plate 110, that is, the exposed surface 111. As described above, the step difference portion 114 may be formed at the edge portion of the lower surface of the heat radiating plate 110 via separate processing.

According to the present invention, the preparing (S100) of the heat radiating plate 110 includes etching (S110) of cutting the edge portion of the other surface. Through the etching (S110), the step difference portion 114 is concavely formed at a boundary portion between the exposed surface 111 and the side wall surface 113. In the etching (S110), the width of the step difference portion 114 towards the central region from the side wall surface 113 and the depth of the heat radiating plate 110 from the exposed surface 111 in a thickness direction may be adjusted.

After the etching (S110), the chamfering portion 114r may be formed by performing punching (S120) on the step difference portion 114 of the heat radiating plate 110 at a boundary portion with the side wall surface 113 so as to have a predetermined curvature. Alternatively, the chamfering portion 114r may be rounded.

The fabricating method according to the present invention may further include forming the insulating layer 120 and the circuit pattern 130 on one surface of the heat radiating plate 110, that is, the mounting surface 112.

Then, the fabricating method according to the present invention includes adhering (S200) the external connection terminal 140 to the circuit pattern 130. According to the present invention, an adhesive layer may be interposed between the external connection terminal 140 and the circuit pattern 130 to adhere the external connection terminal 140 to the circuit pattern 130. The adhesive layer may be formed of, but is not limited to, solder, conductive epoxy, etc. The adhesive layer may be formed of an adhesive material with high thermal conductivity in order to effectively dissipate heat generated from the semiconductor chip 170 to be mounted on the external connection terminal 140.

The fabricating method according to the present invention includes mounting (S300) the semiconductor chip 170 on the external connection terminal 140 and wire bonding (S400) of electrically connecting the external connection terminal 140 and the semiconductor chip 170.

Lastly, the fabricating method according to the present invention includes encapsulating (S500) the heat radiating plate 110 and the semiconductor chip 170 by the molding portion 160. As illustrated in FIG. 2, the molding portion 160 encapsulates the heat radiating plate 110 and the semiconductor chip 170 so as not to protrude as compared with a level (or height) of the exposed surface 111 of the heat radiating plate 110. Thus, the molding portion 160 prevents flush on the exposed surface 111.

As described above, the present invention may provide a power module package for preventing a molding material from intruding over an exposed surface of a heat radiating plate during a molding process.

In addition, the present invention uses a heat radiating plate having an ensured escape space for the molding material around an edge portion of the heat radiating plate, thereby preventing the molding material from running off over the exposed surface of the heat radiating plate.

As described above, the present invention may prevent flush and thus does not require a separate process for removing flush during manufacture of a power module package, thereby ensuring a good adhesive state with a heat sink and/or a board to be adhered to the exposed surface of the heat radiating plate as well as remarkably reducing the number of working steps.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package comprising:
   a heat radiating plate including a step difference portion around an edge portion thereof;
   a semiconductor chip mounted on a mounting surface of the heat radiating plate;
   an external connection terminal disposed on an outer periphery of the heat radiating plate, electrically connected to the semiconductor chip, and protruding outwards;
   a wire for electrical connection between the semiconductor chip and the external connection terminal; and
   a molding portion for encapsulation of the semiconductor chip and a portion of the heat radiating plate,
   wherein the molding portion exposes a lower surface of the heat radiating plate through the step difference portion.

2. The power module package as set forth in claim 1, wherein:
   the heat radiating plate includes the mounting surface, an exposed surface opposite to the mounting surface, and a side wall surface connecting the mounting surface and the exposed surface; and
   the step difference portion includes a step difference surface concaved towards a central region of the heat radiating plate from a lower portion of the side wall surface.

3. The power module package as set forth in claim 2, wherein the step difference portion includes a step difference surface formed at a right angle with the exposed surface.

4. The power module package as set forth in claim 2, wherein the step difference portion includes a chamfering portion formed at a boundary portion with the side wall surface.

5. The power module package as set forth in claim 4, wherein the chamfering portion is rounded.

6. The power module package as set forth in claim 2, wherein the step difference portion includes a concave portion concavely formed towards the central region of the heat radiating plate around the step difference surface just below the exposed surface.

7. The power module package as set forth in claim 6, wherein the concave portion is formed at an acute angle with the exposed surface and is concavely formed at an edge portion of the exposed surface.

* * * * *